United States Patent
Zhang et al.

(10) Patent No.: US 10,109,526 B1
(45) Date of Patent: Oct. 23, 2018

(54) ETCH PROFILE CONTROL DURING SKIP VIA FORMATION

(71) Applicant: GLOBALFOUNDRIES Inc., Grand Cayman (KY)

(72) Inventors: Xunyuan Zhang, Troy, NY (US); Nicholas V. LiCausi, Watervliet, NY (US); J. Jay McMahon, Clifton Park, NY (US); Ryan S. Smith, Clifton Park, NY (US); Errol Todd Ryan, Clifton Park, NY (US); Shao Beng Law, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/609,408

(22) Filed: May 31, 2017

(51) Int. Cl.
    *H01L 21/768* (2006.01)

(52) U.S. Cl.
    CPC .... *H01L 21/76897* (2013.01); *H01L 21/7682* (2013.01); *H01L 21/76816* (2013.01); *H01L 21/76831* (2013.01); *H01L 21/76834* (2013.01)

(58) Field of Classification Search
    CPC .......... H01L 21/76897; H01L 21/7682; H01L 21/76831; H01L 21/76816; H01L 21/76834
    See application file for complete search history.

(56) References Cited

U.S. PATENT DOCUMENTS

| | | | |
|---|---|---|---|
| 5,216,631 A | 6/1993 | Sliwa, Jr. | |
| 6,684,007 B2 | 1/2004 | Yoshimura et al. | |
| 7,074,717 B2* | 7/2006 | Rhodes | H01L 21/76831 257/E21.507 |
| 7,531,120 B2 | 5/2009 | Van Rijn et al. | |
| 9,805,972 B1* | 10/2017 | Zhang | H01L 21/76816 |
| 9,911,651 B1* | 3/2018 | Briggs | H01L 21/76897 |
| 2010/0321478 A1 | 12/2010 | Sliwa et al. | |
| 2012/0199980 A1* | 8/2012 | Pfuetzner | H01L 21/76814 257/774 |
| 2015/0357282 A1 | 12/2015 | Lau et al. | |

FOREIGN PATENT DOCUMENTS

WO      00/12649 A1     3/2000

* cited by examiner

*Primary Examiner* — Mohsen Ahmadi
*Assistant Examiner* — Gustavo Ramallo
(74) *Attorney, Agent, or Firm* — Thompson Hine LLP; Anthony Canale

(57) ABSTRACT

Structures for a skip via and methods of forming a skip via in an interconnect structure. A metallization level is formed that includes a dielectric layer with a top surface. An opening is formed that extends vertically from the top surface of the dielectric layer into the dielectric layer. A dielectric cap layer is deposited on a bottom surface of the opening. A fill layer is formed inside the opening and extends from the top surface of the dielectric layer to the dielectric cap layer on the bottom surface of the opening. A via opening is etched that extends vertically through the fill layer to the dielectric cap layer on the bottom surface of the opening.

18 Claims, 6 Drawing Sheets

ETCH PROFILE CONTROL DURING SKIP VIA FORMATION

BACKGROUND

The present invention relates to integrated circuits and semiconductor device fabrication and, more specifically, to structures for a skip via and methods of forming a skip via in an interconnect structure.

An interconnect structure may be formed by back-end-of-line (BEOL) processing and used to provide electrical connections with device structures fabricated on a substrate by front-end-of-line (FEOL) processing. Typical constructions for a BEOL interconnect structure include multiple metallization levels arranged in a stack. The metallization levels of the BEOL interconnect structure may be formed by layer deposition, lithography, etching, and polishing techniques characteristic of damascene processes. For example, a dual damascene process etches via openings and trenches in one or more dielectric layers and simultaneously fills the via openings and trenches with conductor to create a metallization level.

Skip vias extend vertically through a metallization level of the BEOL interconnect structure to provide a vertical connection between metallization levels that are separated in the stack by an intervening metallization level. Skip vias may provide area efficiency because skipping the intervening metallization level obviates the need for connecting metallization in the intervening metallization level. However, the via opening in which a skip via is formed has a high aspect ratio because of the need to extend through multiple materials in the stack. The high aspect ratio complicates the etching and filling required to form a skip via.

Improved structures for a skip via and methods of forming a skip via in an interconnect structure are needed.

SUMMARY

According to an embodiment of the invention, a method includes forming a metallization level having a dielectric layer with a top surface, and forming an opening extending vertically from the top surface of the dielectric layer into the dielectric layer. The method further includes depositing a dielectric cap layer on a bottom surface of the opening, and forming a fill layer inside the opening that extends from the top surface of the dielectric layer to the dielectric cap layer on the bottom surface of the opening. A via opening is etched that extends vertically through the fill layer to the dielectric cap layer on the bottom surface of the opening.

According to an embodiment of the invention, a structure includes a metallization level having a dielectric layer with a top surface and an opening. The opening extends vertically from the top surface of the dielectric layer into the dielectric layer to a bottom surface. A dielectric cap layer is located on the bottom surface of the opening. A fill layer is located inside the opening, and extends from the top surface of the dielectric layer to the dielectric cap layer on the bottom surface of the opening. A conductive feature is located in a via opening that extends vertically through the fill layer to the dielectric cap layer on the bottom surface of the opening.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
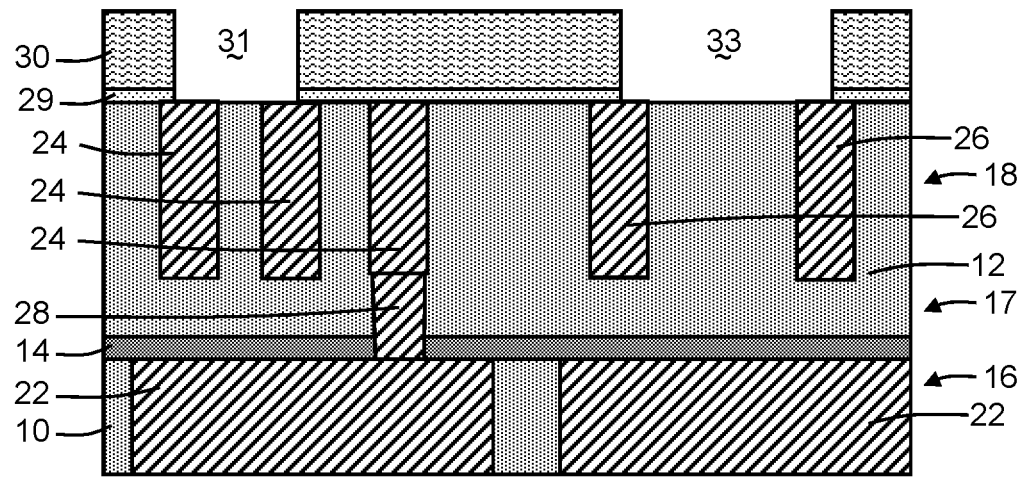
FIGS. 1-8 are cross-sectional views of a structure at successive fabrication stages of a processing method in accordance with embodiments of the invention.

With reference to FIG. 1 and in accordance with embodiment of the invention, dielectric layers 10, 12 and a dielectric cap layer 14 may be processed by back-end-of-line (BEOL) processes to form metallization levels 16, 18 and a via level 17 as respective portions of an interconnect structure. Conductive features 22 are distributed in the lower metallization level 16, a conductive feature 24 is located in the via level 17, and conductive features 26, 28 are distributed in the upper metallization level 18. A sacrificial cap layer 29 may be disposed on the top surface of the dielectric layer 12 and may be formed following the formation of the conductive features 22, 24, 26, 28.

The dielectric layers 10, 12, which may be interlayer dielectric layers, may be composed of an electrical insulator, such as an organic or inorganic dielectric material. Candidate inorganic dielectric materials for dielectric layers 10, 12 may include, but are not limited to, silicon dioxide ($SiO_2$), fluorine-doped silicon glass (FSG), and combinations of these and other dielectric materials. Alternatively, the dielectric material constituting dielectric layers 10, 12 may be characterized by a relative permittivity or dielectric constant that is less than the dielectric constant of silicon dioxide, which is about 3.9. Candidate low-k dielectric materials for dielectric layers 10, 12 include, but are not limited to, organic low-k dielectric materials, inorganic low-k dielectric materials, and combinations of these and other organic and inorganic dielectric materials. The dielectric material constituting the dielectric layers 10, 12 may be deposited by spin-on application, chemical vapor deposition (CVD), etc.

The dielectric cap layer 14 is disposed as a cap on the dielectric layer 10 of the lower metallization level 16 and physically separates the dielectric layer 10 from the dielectric layer 12. The dielectric cap layer 14 may be composed of a dielectric material that etches selectively to the dielectric material forming the dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. For example, the dielectric cap layer 14 may be composed of a dielectric material, such as silicon nitride ($Si_3N_4$), deposited using a deposition process, such as plasma-enhanced chemical vapor deposition (PECVD).

Conductive features 22 of the lower metallization level 16 are arranged in the dielectric layer 10, conductive features 24, 26 of the upper metallization level 18 are arranged in the dielectric layer 12, and a conductive feature 28 of the via level 17 is located in the dielectric layer 12. The conductive feature 28 extends through a partial thickness of the dielectric layer 12 and through the complete thickness of the dielectric cap layer 14 to connect one of the conductive features 24 in the upper metallization level 18 with one of the conductive features 22 of the lower metallization level 16. The conductive features 22 and 24 may be characterized as wires and the conductive feature 28 may be characterized as a via.

The conductive features 22, 24, 26, 28 may be formed in the dielectric layers 10, 12 by a damascene process. The primary conductor used to form the conductive features 22, 24, 26, 28 may be comprised of a low-resistivity metal formed using a deposition process, such as copper (Cu) or a copper alloy formed by electroplating or electroless deposition. The conductive features 24 have a spacing that is determined by a given ground rule, and the conductive features 26 have a spacing that is greater than the spacing of conductive features 24.

A sacrificial layer 30 is applied on the sacrificial cap layer 29 and patterned by lithography and etching to form openings 31, 33 extending through its thickness. The sacrificial layer 30 may be comprised of, for example, an organic planarization layer (OPL) material applied by spin coating. The openings 31, 33 are extended through the sacrificial cap layer 29. The opening 31 overlaps at its side edges with an adjacent pair of the conductive features 24, and the opening 33 overlaps at its side edges with an adjacent pair of the conductive features 26.

Figure 2:
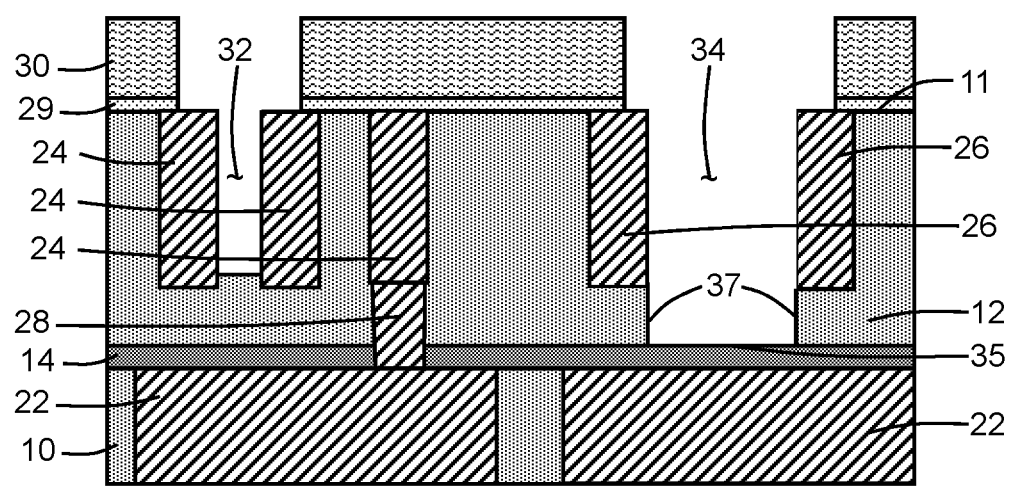

With reference to FIG. 2 in which like reference numerals refer to like features in FIG. 1 and at a subsequent fabrication stage, openings 32, 34 are formed that extend vertically through the dielectric layer 12 to the dielectric cap layer 14 using an etching process, such as reactive-ion etching (ME), with the sacrificial layer 30 operating as an etch mask. The etching process uses an etch chemistry that removes the material of the dielectric layer 12 selective to the materials constituting the conductive features 24, 26 and the dielectric cap layer 14. The dielectric cap layer 14 functions as an etch stop during the formation of opening 34. In an alternative embodiment, the material of the dielectric layer 12 may be damaged by implantation where exposed through the openings 31, 33 and removed with a wet clean.

Opening 32 is formed interior of the opening 31 in the sacrificial layer 30, and opening 34 is formed interior of the opening 33 in the sacrificial layer 30. The conductive features 24 function to self-align the opening 32 such that the opening 32 extends vertically between an adjacent pair of the conductive features 24 to a given depth within the upper metallization level 18. The conductive features 26 function to self-align the opening 34 such that the opening 34 extends vertically between an adjacent pair of the conductive features 26 through the dielectric layer 12 in the upper metallization level 18 and through the dielectric layer 12 in the via level 17 to reach the dielectric cap layer 14. One or more sidewalls 37 of the opening 34 extend from the top surface 11 of the dielectric layer 12 to a bottom surface 35 at the dielectric cap layer 14. Opening 34 is larger in lateral dimensions than the opening 32 because the conductive features 26 have a wider spacing than conductive features 24.

Figure 3:
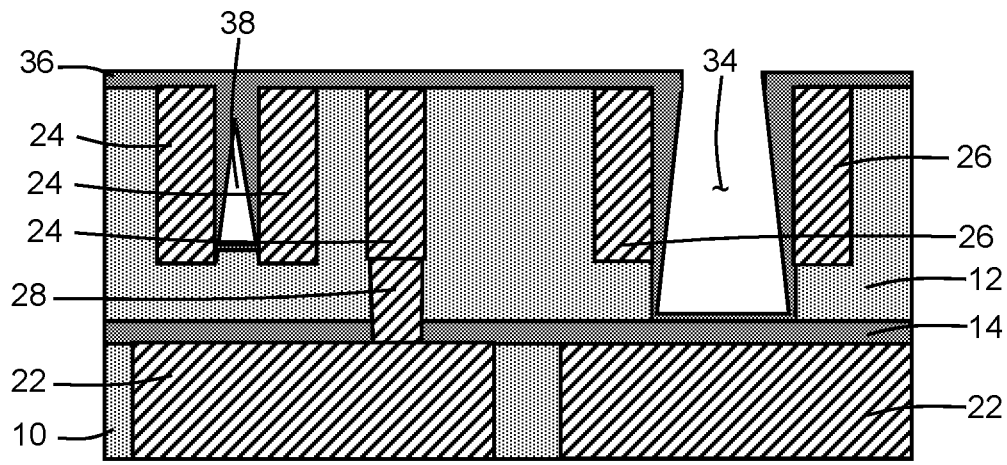

With reference to FIG. 3 in which like reference numerals refer to like features in FIG. 2 and at a subsequent fabrication stage, the sacrificial cap layer 29 and sacrificial layer 30 are removed. A dielectric cap layer 36 is formed inside the openings 32, 34 and on the respective top surfaces of the dielectric layer 12 and conductive features 24, 26. The dielectric cap layer 36 may be composed of a dielectric material, such as silicon nitride ($Si_3N_4$), that is deposited with a non-conformal deposition technique, such as chemical vapor deposition (CVD).

The dielectric cap layer 36 deposits on the one or more sidewalls 37 and bottom surface of opening 34. The opening 34 is only partially filled by the dielectric material of the dielectric cap layer 36 and the entrance to the opening 34 is not occluded despite the presence of an overhang. The thickness of the dielectric material of the dielectric cap layer 36 at the bottom of the opening 34 may be thin compared with the thickness of the dielectric cap layer 36 near and at the top portion of the opening 34. Due to the self-alignment during the formation of the opening 34, the dielectric cap layer 36 is in direct contact with the conductive features 26 and the dielectric layer 12 bordering the one or more sidewalls 37 of the opening 34, as well as in direct contact with the dielectric cap layer 14 bordering the bottom surface 35 of the opening 34.

The dielectric material of the dielectric cap layer 36 that deposits inside the opening 32 may pinch off during growth and encapsulate an air gap 38. The air gap 38 represents an unfilled portion of the opening 32. The air gap 38 may be characterized by an effective permittivity or dielectric constant of near unity (vacuum permittivity). The air gap 38 may be filled by atmospheric air at or near atmospheric pressure, may be filled by another gas at or near atmospheric pressure, or may contain atmospheric air or another gas at a sub-atmospheric pressure (e.g., a partial vacuum). The pinch-off of the dielectric cap layer 36 inside the opening 32 occurs because of the smaller lateral dimensions of the opening 32 in comparison with the opening 34, which does not experience pinch-off by the deposited dielectric material of the dielectric cap layer 36.

Figure 4:
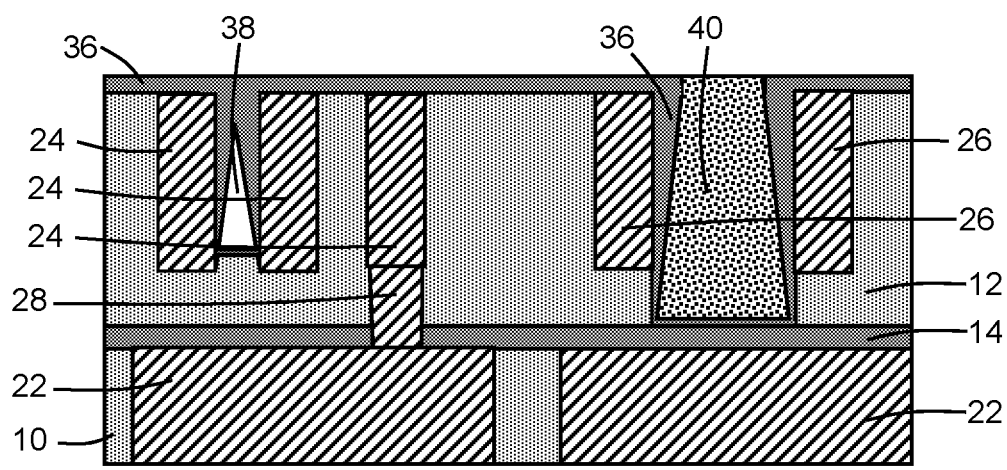

With reference to FIG. 4 in which like reference numerals refer to like features in FIG. 3 and at a subsequent fabrication stage, the open space inside the opening 34 that is interior of the dielectric cap layer 36 is filled by a fill layer 40. In an embodiment, the fill layer 40 may be composed of a flowable dielectric material that is capable of filling of high-aspect ratio gaps. The material for the fill layer 40 is selected to etch selectively to the material of the dielectric cap layer 36. For example, the material of the fill layer 40 may be selected to etch faster than the material of the dielectric cap layer 36. In an embodiment, the fill layer 40 may be composed of a low-k dielectric material, such as silicon carbon oxide, that is deposited by a flowable chemical vapor deposition (CVD) deposition process and etched back to expose the dielectric cap layer 36 on the respective top surfaces of the dielectric layer 12 and conductive features 24, 26. The fill layer 40 is exposed at the top surface of the opening 34 and is not masked by the dielectric cap layer 36.

Figure 5:
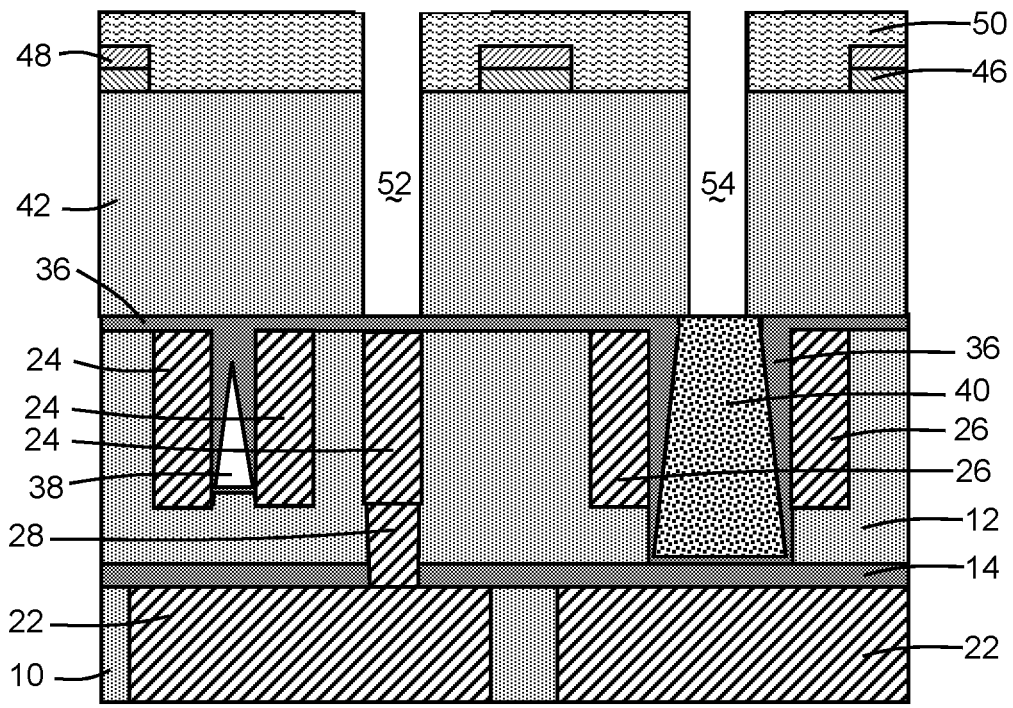

With reference to FIG. 5 in which like reference numerals refer to like features in FIG. 4 and at a subsequent fabrication stage, a dielectric layer 42 similar to dielectric layer 12 is deposited in a stack on the dielectric layer 12. The dielectric layer 42 is subsequently processed to form a metallization level and a via level of the interconnect structure that overlies metallization level 18. A hardmask 46 composed of, for example, titanium nitride (TiN) and a dielectric hardmask 48 composed of, for example, silicon dioxide ($SiO_2$) are formed in a layer stack on the dielectric layer 42. The hardmasks 46, 48 are patterned to define an etch mask with openings intended for the locating trenches etched in the dielectric layer 42.

A lithography stack 50 is applied and patterned, and then used to pattern the dielectric layer 42 to define openings 52, 54 in the dielectric layer 42 registered with the patterned openings in the lithography stack 50. The lithography stack 50 may include, for example, an anti-reflective coating and a layer of photoresist, and the openings 52, 54 may be formed using an etching process, such as a reactive-ion etching (ME). The opening 52 extends to a section of the dielectric cap layer 36 overlying the conductive feature 24 that is coupled by conductive feature 28 with one of the underlying conductive features 22 in the lower metallization level 16. The opening 52 is also arranged within the boundary of one of the openings extending through the hardmasks 46, 48. The opening 54 extends to the fill layer 40 that is inside the opening 34 and is arranged within the boundary of another of the openings extending through the hardmasks 46, 48. As is characteristic of a dual-damascene process, the openings 52, 54 may be dimensionally smaller in size than the corresponding openings formed in the hardmasks 46, 48.

Figure 6:
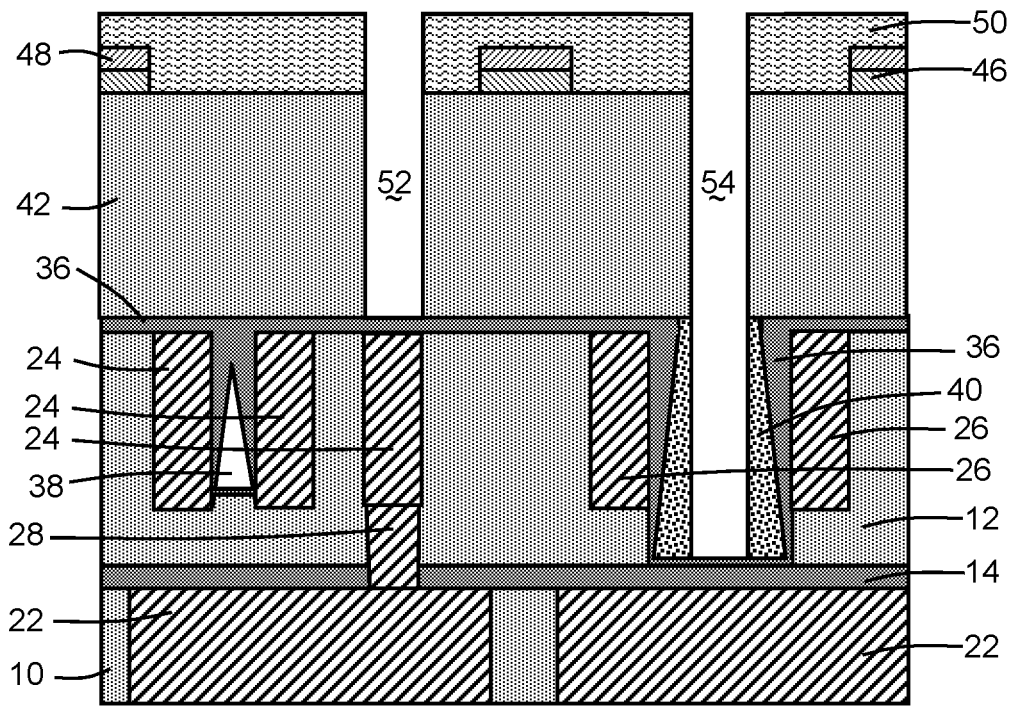

With reference to FIG. 6 in which like reference numerals refer to like features in FIG. 5 and at a subsequent fabrication stage, the opening 54 is extended into the fill layer 40 and completely through the fill layer 40 to penetrate to the depth of the section of the dielectric cap layer 36 at the bottom of the opening 34. The opening 54 may be extended in depth to penetrate through fill layer 40 using an etching process, such as a reactive-ion etching (ME). The etching process may be a continuation of the etching process used to form the openings 52, 54 with the dielectric cap layer 36 functioning as a etch stop with respect to opening 52. Alternatively, the etching process may be a different etching process than used to form the openings 52, 54 in dielectric layer 42 and characterized by an etch chemistry that removes the material of fill layer 40 selective to the material of the dielectric cap layer 36 at the bottom of the opening 34 and/or the material of the dielectric cap layer 14.

Figure 7:
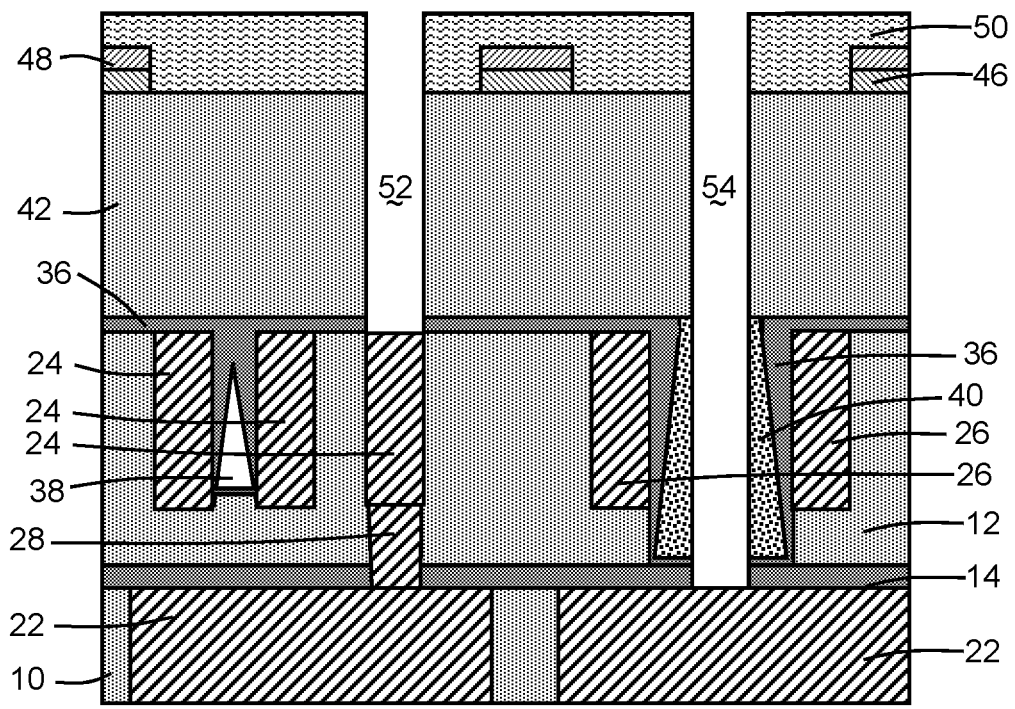

With reference to FIG. 7 in which like reference numerals refer to like features in FIG. 6 and at a subsequent fabrication stage, the opening 52 is extended through the dielectric cap layer 14 to reach one of the conductive features 24 in the upper metallization level 18. The opening 54 is concurrently extended through the dielectric cap layer 36 at the bottom of the opening 34 and the dielectric cap layer 14 beneath the dielectric cap layer 36 to reach one of the conductive features 22 in the lower metallization level 16. The openings 52, 54 may be extended in depth using an etching process, such as a reactive-ion etching (ME), with an etch chemistry that removes the material of the dielectric cap layers 14, 36. The opening 54 penetrates completely through the upper metallization level 18 without contacting any of its conductive features 24, 26.

Figure 8:
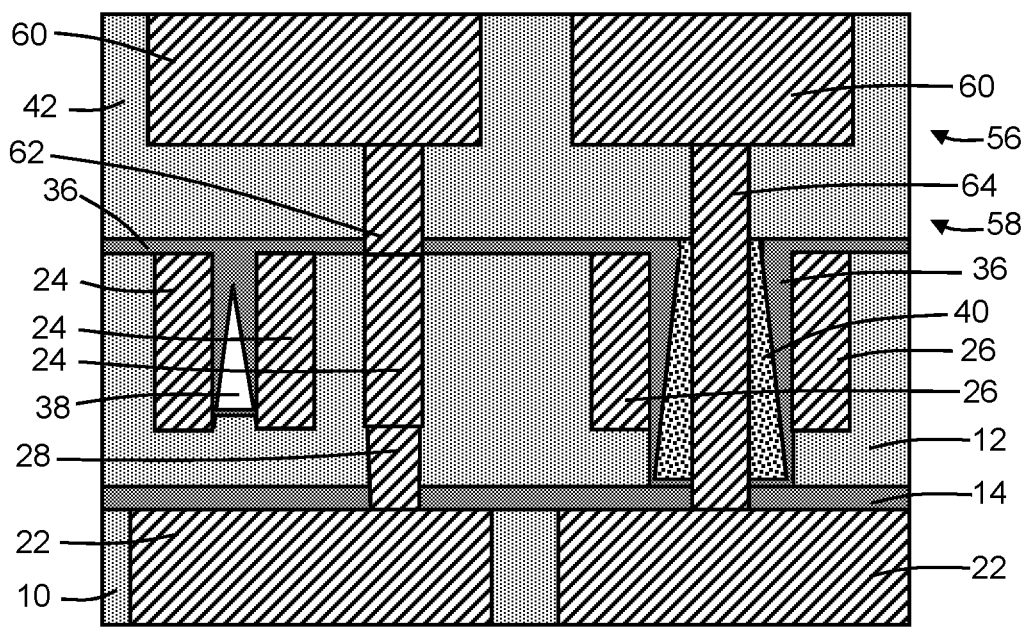

With reference to FIG. 8 in which like reference numerals refer to like features in FIG. 7 and at a subsequent fabrication stage, the lithography stack 50 is stripped, and an etching process, such as a reactive-ion etching (ME), is used in conjunction with the patterned hardmasks 46, 48 to form trenches extending partially through the dielectric layer 42 in a vertical direction. Conductive features 60 are formed in the trenches in dielectric layer 42 to define a metallization level 56 of the interconnect structure, and conductive features 62, 64 are respectively formed in the openings 52, 54 in dielectric layer 42 to define a via level 58 of the interconnect structure. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches and openings 52, 54 before filling with the primary electrical conductor. The primary conductor may be comprised of a low-resistivity metal formed using a deposition process, such as copper (Cu) formed by electroplating or electroless deposition.

The conductive features 60, 62, 64 are embedded in the dielectric material constituting the dielectric layer 42. The conductor of the conductive feature 64 inside the opening 54 operates as a skip via that establishes electrical and physical contact between one of the conductive features 60 in the metallization level 56 and one of the conductive features 22 in the lower metallization level 16. The conductive feature 64 does not electrically or physically contact any of the conductive features 26, 28 in upper metallization level 18. For example, sections of the fill layer 40 and the dielectric cap layer 36 are located as electrical insulators between the conductive features 28 and the conductive feature 64 in the opening 54.

Figure 9:
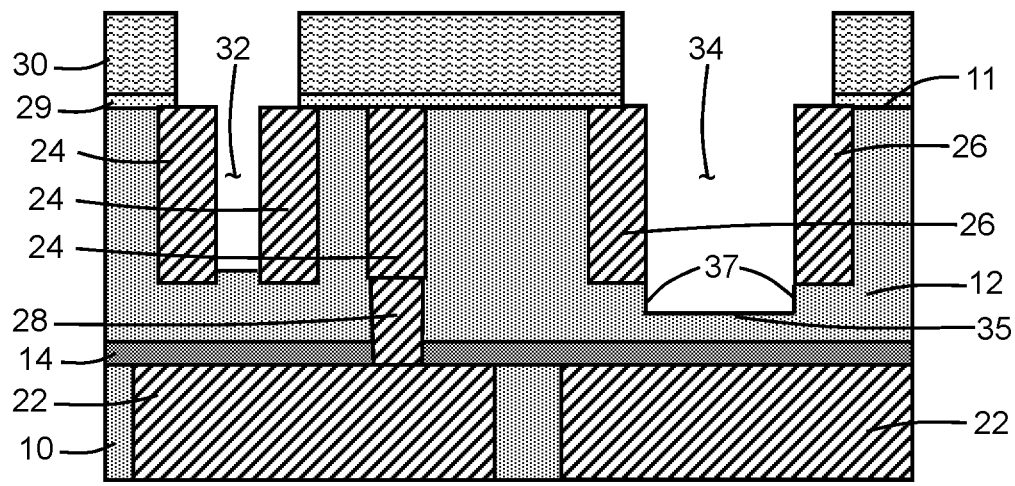
FIGS. 9-12 are cross-sectional views of a structure at successive fabrication stages of a processing method in accordance with embodiments of the invention.

With reference to FIG. 9 in which like reference numerals refer to like features in FIG. 2 and in accordance with embodiments of the invention, the opening 34 may only extend from the top surface 11 of the dielectric layer 12 only partially through the thickness of the dielectric layer 12 such that the opening 34 fails to fully extend to the dielectric cap layer 14. The conductive features 26 function to self-align the opening 34 such that the opening 34 extends between an adjacent pair of the conductive features 26. A section of the dielectric layer 12 is located between the bottom surface 35 of the opening 34 and the dielectric cap layer 14.

Figure 10:
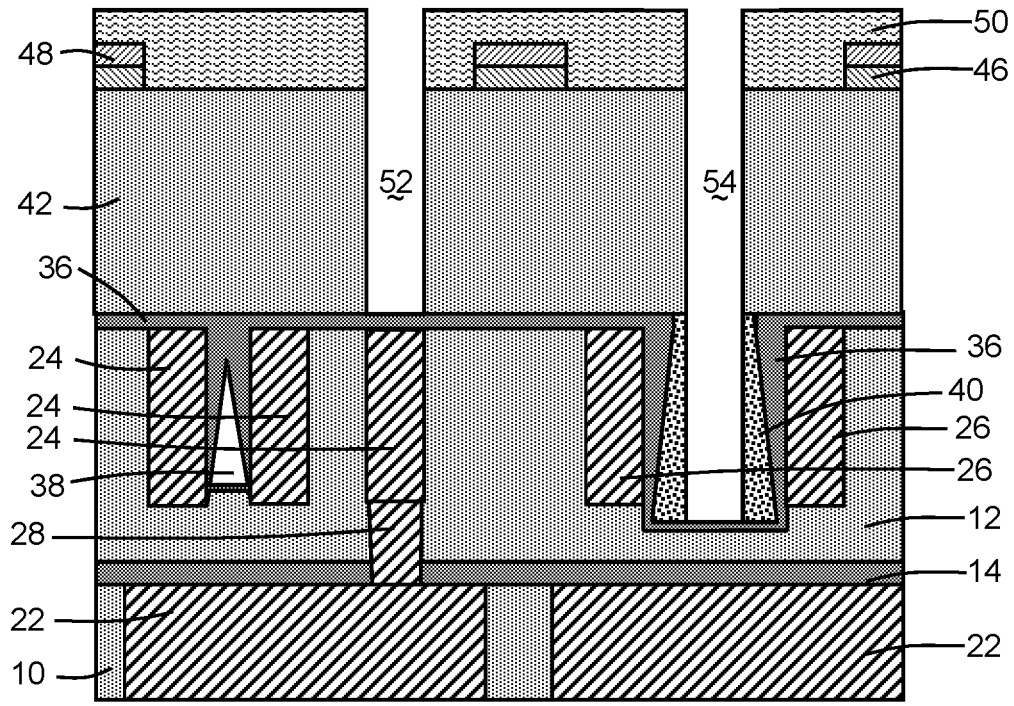

With reference to FIG. 10 in which like reference numerals refer to like features in FIG. 9 and at a subsequent fabrication stage, processing continues as described in the context of FIGS. 2-5. The dielectric cap layer 36, when formed, covers the partial thickness of the dielectric layer 12 at the bottom of opening 34, and fill layer 40 is formed inside the opening 34. The opening 54 may be extended through fill layer 40 to the section of the dielectric cap layer 36 covering the partial thickness of the dielectric layer 12 at the bottom of opening 34.

Figure 11:
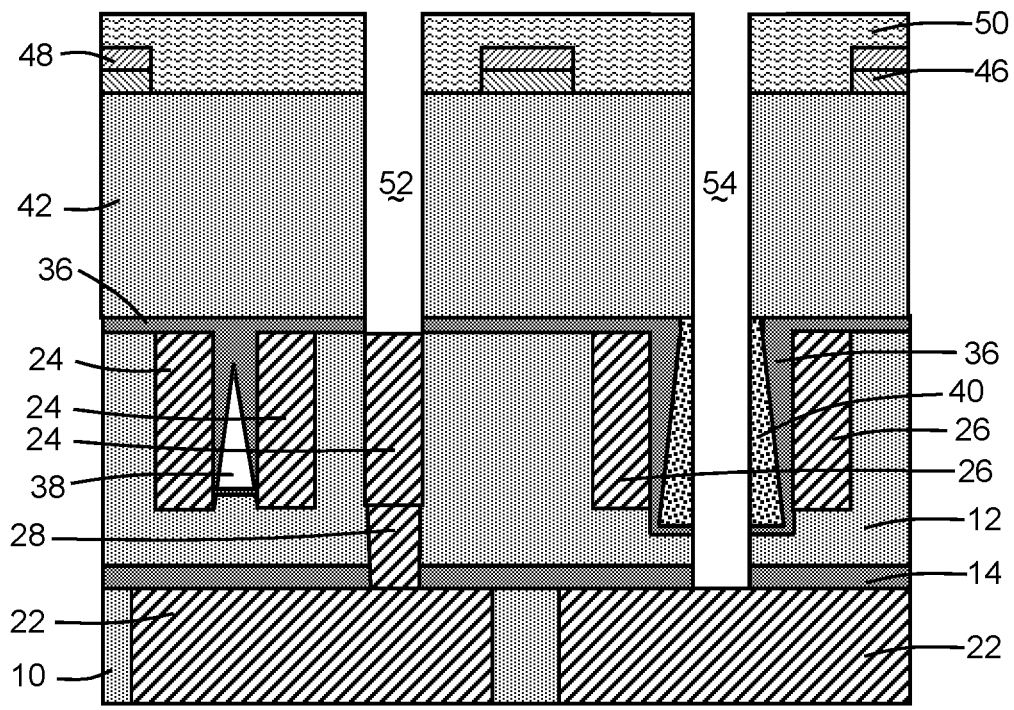

With reference to FIG. 11 in which like reference numerals refer to like features in FIG. 10 and at a subsequent fabrication stage, the opening 54 may be serially extended through the dielectric cap layer 36 covering the partial thickness of the dielectric layer 12 at the bottom of opening 34, the partial thickness of the dielectric layer 12 between the dielectric cap layer 36 and dielectric cap layer 14, and the dielectric cap layer 14 to reach the conductive feature 22.

Figure 12:
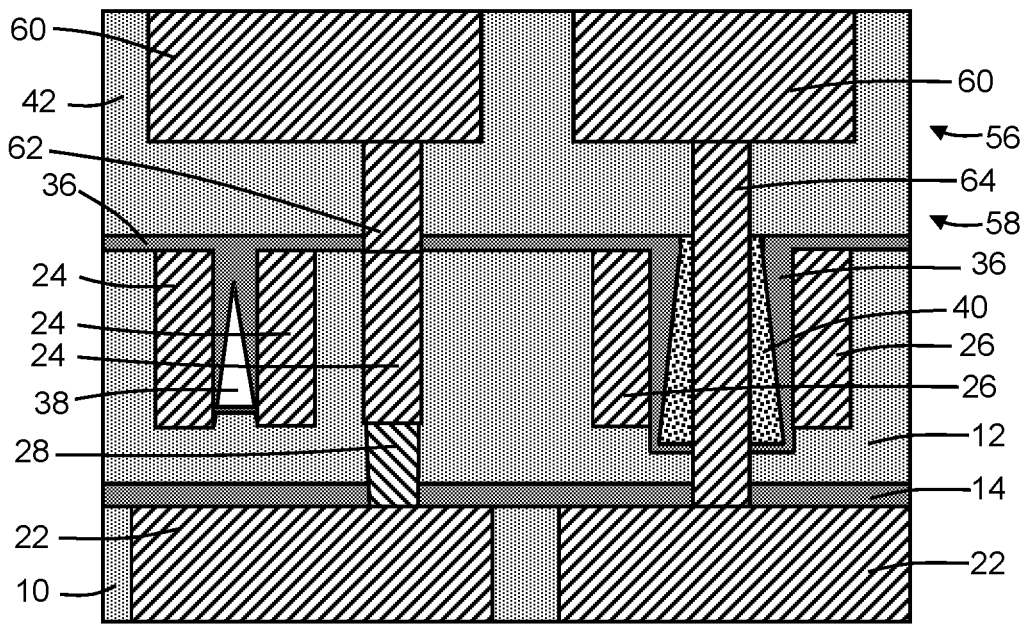

With reference to FIG. 12 in which like reference numerals refer to like features in FIG. 11 and at a subsequent fabrication stage, the conductive features 60, 62, 64 are embedded in the dielectric layer 42. The conductive feature 64 extends through the partial thickness of the dielectric layer 12 between the dielectric cap layer 36 and dielectric cap layer 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first metallization level having a first dielectric layer with a top surface, a first conductive feature in the first dielectric layer, and a second conductive feature in the first dielectric layer;
    forming a first opening extending vertically from the top surface of the first dielectric layer between the first conductive feature and the second conductive feature and into the first dielectric layer;
    depositing a dielectric cap layer on the bottom surface of the first opening;
    forming a fill layer inside the first opening that extends from the top surface of the first dielectric layer to the dielectric cap layer on the bottom surface of the first opening;
    etching a via opening extending vertically through the fill layer and the dielectric cap layer on the bottom surface of the first opening; and
    forming a third conductive feature in the via opening.

2. The method of claim 1 further comprising:
    forming a second dielectric layer of a second metallization level on the top surface of the first dielectric layer,
    wherein the via opening extends vertically in part through the second dielectric layer.

3. The method of claim 1 wherein the first conductive feature and the second conductive feature self-align the first opening when the first opening is formed such that the first conductive feature and the second conductive feature each directly border a sidewall of the first opening.

4. The method of claim 1 wherein the first opening includes one or more sidewalls that extend from the top surface of the first dielectric layer to the bottom surface, and the dielectric cap layer forms on the one or more sidewalls of the first opening.

5. The method of claim 1 wherein the first opening extends completely through the first dielectric layer.

6. The method of claim 5 wherein the first metallization level is formed on a second metallization level, and the via opening and the third conductive feature extend vertically to a fourth conductive feature in the second metallization level.

7. The method of claim 1 wherein the first opening extends partially through the first dielectric layer, and further comprising:
    extending the via opening through a section of the first dielectric layer beneath the bottom surface of the first opening.

8. The method of claim 1 further comprising:
    forming a second opening extending vertically from the top surface of the first dielectric layer into the first dielectric layer,
    wherein the dielectric cap layer partially fills the second opening to encapsulate an air gap.

9. The method of claim 8 further comprising:
    forming a fourth conductive feature and a fifth conductive feature in the first dielectric layer,
    wherein the second opening extends from the top surface of the first dielectric layer into the first dielectric layer between the fourth conductive feature and the fifth conductive feature, and the air gap is located between the fourth conductive feature and the fifth conductive feature.

10. A structure comprising:
    a first metallization level having a first dielectric layer with a top surface and a first opening, a first conductive feature in the first dielectric layer, and a second conductive feature in the first dielectric layer, the first opening extending vertically from the top surface of the first dielectric layer into the first dielectric layer between the first conductive feature and the second conductive feature and to a bottom surface;
    a dielectric cap layer on the bottom surface of the first opening;
    a fill layer inside the first opening, the fill layer extending from the top surface of the first dielectric layer to the dielectric cap layer on the bottom surface of the first opening; and
    a third conductive feature in a via opening extending vertically through the fill layer and the dielectric cap layer on the bottom surface of the first opening.

11. The structure of claim 10 further comprising:
    a second metallization level having a second dielectric layer on the top surface of the first dielectric layer,
    wherein the via opening extends vertically in part through the second dielectric layer.

12. The structure of claim 10 wherein the first conductive feature and the second conductive feature self-align the first opening when the first opening is formed such that the first conductive feature and the second conductive feature each directly border a sidewall of the first opening.

13. The structure of claim 10 wherein the first opening includes one or more sidewalls that extend from the top surface of the first dielectric layer to the bottom surface, and the dielectric cap layer forms on the one or more sidewalls of the first opening.

14. The structure of claim 10 wherein the first opening extends completely through the first dielectric layer, the fill layer is comprised of a first dielectric material, and the dielectric cap layer is composed of a second dielectric material that etches selectively to the first dielectric material.

15. The structure of claim 14 further comprising:
    a second metallization level having a fourth conductive feature,
    wherein the first metallization level is formed on the second metallization level, and the via opening and the third conductive feature extend vertically to the fourth conductive feature in the second metallization level.

16. The structure of claim 10 wherein the first opening extends partially through the first dielectric layer, the fill layer is comprised of a first dielectric material, and the dielectric cap layer is composed of a second dielectric material that etches selectively to the first dielectric material.

17. The structure of claim 10 further comprising:
forming a second opening extending vertically from the top surface of the first dielectric layer into the first dielectric layer,
wherein the dielectric cap layer partially fills the second opening to encapsulate an air gap.

18. The structure of claim 17 wherein the first metallization level includes a fourth conductive feature and a fifth conductive feature in the first dielectric layer, the second opening extends from the top surface of the first dielectric layer into the first dielectric layer between the fourth conductive feature and the fifth conductive feature, and the air gap is located between the fourth conductive feature and the fifth conductive feature.

* * * * *